(12) United States Patent
Karg et al.

(10) Patent No.: US 7,569,459 B2
(45) Date of Patent: Aug. 4, 2009

(54) NONVOLATILE PROGRAMMABLE RESISTOR MEMORY CELL

(75) Inventors: Siegfried F Karg, Adliswil (CH); Gerhard Ingmar Meijer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 573 days.

(21) Appl. No.: 11/427,820

(22) Filed: Jun. 30, 2006

(65) Prior Publication Data

US 2008/0001172 A1    Jan. 3, 2008

(51) Int. Cl.
*H01L 21/20* (2006.01)

(52) U.S. Cl. .................. 438/385; 438/382; 438/104; 257/194; 365/148

(58) Field of Classification Search ................. 438/100, 438/104, 171, 190, 200, 210, 238, 381–385; 257/194; 365/148
See application file for complete search history.

(56) References Cited

U.S. PATENT DOCUMENTS 7,402,456 B2 * 7/2008 Zhuang et al. .............. 438/100

\* cited by examiner

*Primary Examiner*—Thinh T Nguyen
(74) *Attorney, Agent, or Firm*—Michael J. Buchenhorner; Stephen C. Kaufman

(57) ABSTRACT

A nonvolatile programmable resistance memory cell comprising a high-mobility ion conductor and a method for fabricating the same are provides. The memory cell comprises of a first and second electrode and a reversible and persistent programmable resistance structure connecting the first and second electrode. The resistance is modifiable by altering the ionic distribution of a high-mobility oxygen ion conductor region. As an alternate embodiment, the memory cell further includes a transition-metal oxide region.

1 Claim, 3 Drawing Sheets

NONVOLATILE PROGRAMMABLE RESISTOR MEMORY CELL

BACKGROUND OF THE INVENTION

1. Field of the Invention

This invention relates generally to integrated circuit memories and, more particularly, to a nonvolatile memory cell for use in integrated circuits.

2. Description of the Related Prior Art

Recently, materials displaying the ability to be reversibly switched between two stable electrical resistance states have been proposed for use in nonvolatile memories. When incorporated in a memory cell, these materials can be toggled between higher and lower electrical resistance states by applying a pulse of electrical current ("switching current pulse"to the materials. Subsequently, after writing to a memory cell in this way, the electrical resistance state of the given memory cell can be determined (i.e., read) by applying a sensing current pulse to the material in order to determine its electrical resistance state. The amplitude of the sensing current pulse is preferably sufficiently smaller than the amplitude of the switching current pulse so that the electrical resistance state of the material is not altered by the read operation, and the written electrical resistance state persists.

The electrical resistance of resistance-switching materials, including but not limited to transition-metal oxides and metal sulphides, can be changed significantly by external influences, including electrical fields, magnetic fields, and temperature. Electrical impulses applied to these materials can "program" memory devices, such that they exhibit a desired resistive property. Specifically, the referenced articles and U.S. Patents, all of which are hereby expressly incorporated by reference into the present invention for purposes including, but not limited to, indicating the background of the present invention and illustrating the state of the art, describe materials and classes of materials with programmable electrical resistance and simple electrical resistor devices made from these materials: "Reproducible switching effect in thin oxide films for memory applications" (A. Beck et at., Applied Physics Letters, Vol. 77, No. 1, July 2000); "Quantized conductance atomic switch" (K. Terabe et at., Nature 433, 6 Jan. 2005); U.S. Pat. No. 6,815,744 issued to Beck et al on Nov. 9, 2004; and, U.S. Pat. No. 6,204,139 issued to Liu et al. on Mar. 20, 2001.

Transition-metal oxides and metal sulphides are classes of materials that can be conditioned such that they exhibit the desired bistable electrical resistance. This conditioning process involves subjecting the insulating dielectric material to an appropriate electrical signal for a sufficient period of time. This conditioning process is believed to generate a confined conductive region of arbitrary shape in the transition-metal oxide or metal sulphide. This region is formed near local perturbations such as vacancies, defects, impurities, grain boundaries, or roughness. The conditioning process of the programmable resistance materials can be accelerated, for example, by incorporating oxygen vacancies in the material during the fabrication process. It is believed that it is the interface region near the electrodes that can be reversibly switched between two or more resistance states by applying a pulse of electrical current to the materials.

The confined conductive region is generated at an arbitrary position in the dielectric material, i.e., the position of the conducting path is not controlled by well-defined process parameters. This leads to a large variation in the electrical properties of nominally identical memory cells comprising conventional programmable resistors and of devices comprising such memory cells. Moreover, only a part of the area defined by the electrodes is used for current flow. Hence, the confined region is subject to local heating and to potential damage.

The time-consuming conditioning process and the large variations of the properties of nominally identical programmable resistors used in the memory cells and in devices formed with such memory cells severely hinders manufacturability and is impractical for production type arrays.

A disadvantage of the above-mentioned material is that a conditioning process is required.

Another disadvantage of the prior-art memory devices is their long response time, ranging from typically 100 ns to 10 µs.

A further disadvantage is the large statistical spread of the operating conditions of the devices.

SUMMARY AND OBJECTS OF THE INVENTION

An object of the present invention is to provide a nonvolatile programmable resistance memory cell having a high oxygen-ion mobility leading to a significantly improved response time of the resistance switching upon application of external voltage or current.

Yet another object of the present invention is to provide memory devices that do not require a conditioning process.

Still another object of the present invention is to provide a programmable resistance memory cell that are more reliable and have a lower statistical spread of operating characteristics.

To overcome the aforementioned drawbacks and limitations, the present invention provides both an improved nonvolatile programmable resistance memory cell structure and an improved method for fabricating the same.

According to the present invention, a nonvolatile programmable resistor memory cell comprises a first electrode, a second electrode facing the first electrode and a reversible and persistent programmable resistance structure connecting the first and second electrode, the resistance being modified by altering the oxygen ionic distribution provided by a high-mobility oxygen ion conductor region in the structure by applying electric field.

The present invention also relates to a nonvolatile programmable resistor memory cell comprising a high-mobility oxygen ion conductor region and a transition-metal oxide region that exhibits a filling-controlled metal-insulator transition, and two electrodes.

The high ionic mobility provides a high conductivity that leads to devices that do not require a conditioning process or accelerates the conditioning process to a negligible duration. Non-uniformities associated with the conditioning process, i.e., the soft dielectric breakdown to generate a confined conductive region in the material, are eliminated. Concomitantly, the variation of the properties of nominally identical programmable resistors used in the memory cells and of devices comprising such memory cells is reduced significantly.

The present invention also provides a method for fabricating a nonvolatile programmable resistor memory cell, the method comprising the steps of forming a first electrode, forming a second electrode facing the first electrode and providing a resistance structure with a high mobility oxygen-ion conductor region, the oxygen ionic distribution of the region being modifiable by external electric field.

BRIEF DESCRIPTION OF THE ACCOMPANYING DRAWINGS

The accompanying drawings illustrate the preferred embodiments of the invention and together with the following detailed description serve to explain the principles of the invention.

DESCRIPTION OF THE PREFERRED EMBODIMENTS

Figure 1:
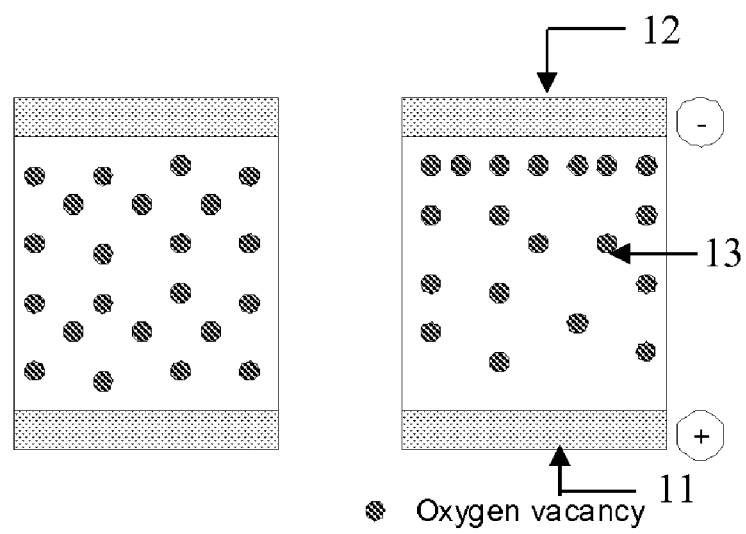
FIG. 1 is a schematic illustration of the nonvolatile programmable resistor memory cell according to the first embodiment of the present invention.

For the purpose of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

It will be understood by those skilled in the art that the foregoing general description and the following detailed description are exemplary and explanatory of the invention and are not intended to be restrictive thereof.

As shown in FIG. 1, the nonvolatile programmable resistor memory cell 10 according to the first embodiment of this invention consists of a sandwich-type structure comprising a high-mobility oxygen ion conductor region 13 and two electrodes 11, 12.

An electrical signal applied to the electrodes 11, 12 causes migration of oxygen ions within the high-mobility oxygen ion conductor layer 13 towards the electrode (and vice versa). An applied voltage thus alters the oxygen ion concentration in the vicinity of the electrodes and hence the energy barriers for charge carrier injection and therefore the resistance of the memory cell. The interface region near the electrodes can be reversibly switched between two or more resistance states associated with migration of oxygen ions.

Figure 2:
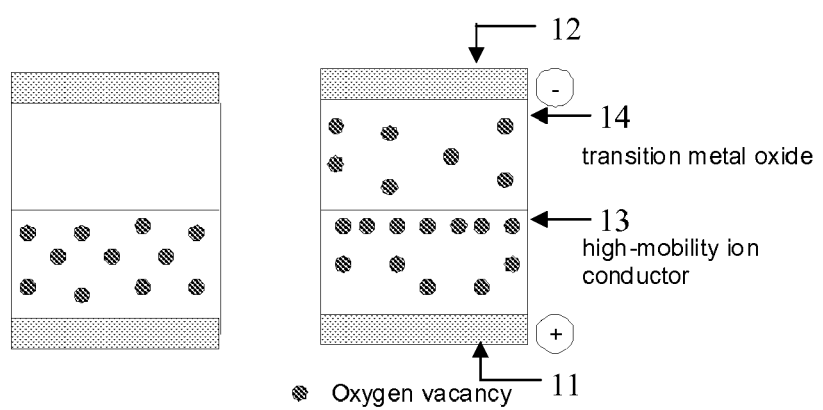
FIG. 2 is a schematic illustration of the nonvolatile programmable resistor memory cell according to the second embodiment of the present invention.

FIG. 2 of the accompanying drawings depicts the second embodiment of this invention. The memory cell 10 according to this embodiment is a sandwich-type structure comprising a high-mobility oxygen ion conductor region and a transition-metal oxide region 14 that exhibits a filling-controlled metal-insulator transition, and two electrodes 11, 12. An electrical signal applied to the electrodes causes migration of oxygen ions from the high-mobility oxygen ion conductor region 13 into the transition-metal oxide region 14 (and vice versa). This changes the formal oxidation state of the transition metal ion in the transition-metal oxide layer and concomitantly the filling of the transition metal band. The initial doping level of the transition-metal region can be chosen such that a significant change of the resistance of the transition-oxide metal oxide layer is obtained for a small change in oxygen stoichiometry. Therefore the resistance of the memory cell can be reversibly switched between two or more resistance states. Preferably, at least one of the electrodes is transparent for oxygen.

Good oxide-ion conduction requires partial occupancy of energetically equivalent oxide-ion lattice sites. The oxygen ions can then move by diffusion. The high-mobility oxygen ion conductor region may comprise $Ce_{0.9}Gd_{0.1}O_{1.95}$ or $Bi_4V_{1.8}Cu_{0.2}O_{10.7}$. Other high-mobility oxygen ion conductors such as fluorite-type with extrinsic oxide-ion vacancies (such as stabilized zirconia $(ZrO_2)_{1-x}((Y,Sc)_2O_3)_x$, doped ceria $(Ce,Gd)O_{2-x}$, $\delta$-$Bi_2O_3$), perovskites with intrinsic or extrinsic vacancies (such as $(La,Sr)(Ga,Mg)O_{3-x}$, $BaInO_{2.5}$, $(Li,La)TiO_{3-x}$), Aurivillius-type oxides (such as $Bi_4(V,Ti,Cu)_2O_{11-x}$), pyrochlores (such as $Gd_2(Zr,Ti)_2O_7$), and oxides like $La_2Mo_2O_9$ can be used advantageously for the present invention too.

Materials exhibiting a so-called filling-controlled metal-insulator transition are preferred for the transition-metal oxide region. Examples are the corundum vanadium and/or chromium oxide $(V,Cr)_2O_{3-x}$ and perovskites such as $(La,Sr)MO_{3-x}$, M being a 3d transition metal element. The parent perovskite compounds $LaMO_3$ and $SrMO_3$ are Mott or charge-transfer insulators, and upon changing the band filling, for example associated with oxygen vacancies, a metallic state is obtained. Most preferable are strontium titanium oxide $SrTiO_{3-x}$, lanthanum titanium oxide $LaTiO_{3+x}$, yttrium and/or calcium titanium oxide $(Y,Ca)TiO_{3-x}$, and lanthanum and/or strontium manganese oxide $(La,Sr)MnO_{3-x}$ because of their strong dependence of the room-temperature resistance on the oxygen stoichiometry. Other examples of materials that are advantageously usable include binary transition-metal oxides such as nickel oxide $NiO_x$, strontium and/or barium titanium oxide $(Sr,Ba)TiO_3$, praseodymium and/or calcium manganese oxide $(Pr,Ca)MnO_3$, strontium zirconium oxide $SrZrO_3$, each material doped preferentially with chromium, manganese, or vanadium. Further, the materials described in the above-mentioned documents, incorporated herein by reference, are advantageously usable in a memory device of the present invention.

Figure 3:
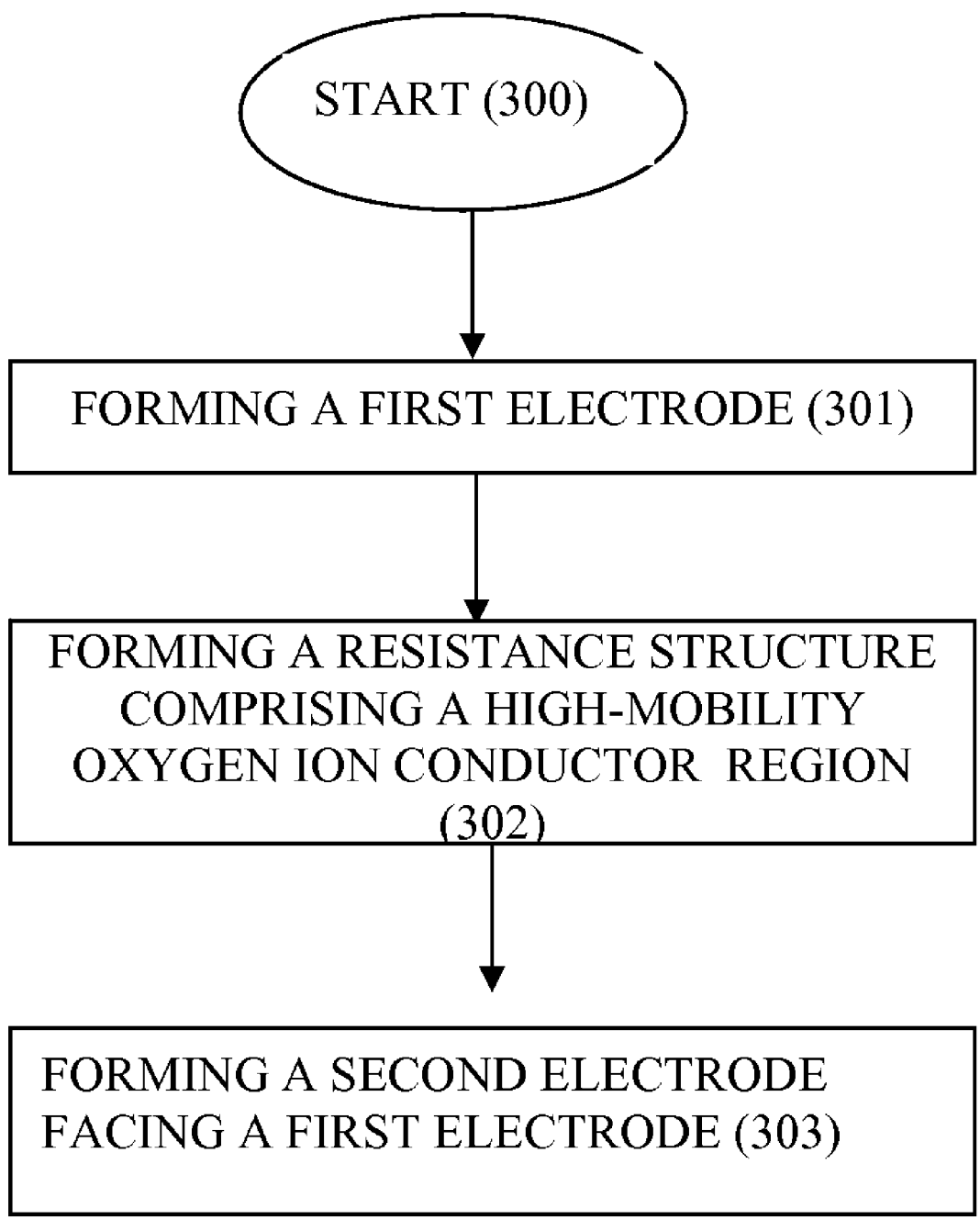
FIG. 3 is a flow chart illustrating the present invention method for fabricating a nonvolatile programmable resistor memory cell.

FIG. 3 illustrates the sequence of steps for fabricating a nonvolatile programmable resistor memory cell according to the present invention. It should however be understood that some of the steps can be performed in parallel or performed without the requirement of maintaining a strict order of sequence. The method begins at step 300. In steps 301 and 303 the first and second electrode are formed respectively, the second electrode facing the first electrode. A resistance structure comprising a high-mobility oxygen ion conductor region is provided between the first and second electrode in step 302. To modify the resistance of the memory cell, electric field is applied to the electrodes which causes the migration of the oxygen ions within the said region.

It is also to be understood that the present invention is not limited to the embodiments described above, but encompasses any and all embodiments within the scope of the following claims.

What is claimed:

1. A method of fabricating a nonvolatile programmable resistor memory cell, the method comprising steps of:
   forming a first electrode;
   forming a second electrode facing the first electrode, wherein at least one electrode is transparent to oxygen ions; and
   providing a resistance structure comprising:
      a high-mobility oxygen ion conductor region comprising one selected from a group consisting of: fluorite-type with extrinsic oxide-ion vacancies, doped ceria, perovskites with intrinsic or extrinsic vacancies, Aurivillius-type oxides, and pyrochlores; and wherein the high-mobility oxygen ion conductor region is characterized by a partial occupancy of energetically equivalent oxide-ion lattice sites, the oxygen ionic distribution of the region being modifiable by external electric field, and wherein the high-mobility oxygen ion conductor region comprises $Ce_{0.9}Gd_{0.1}O_{1.95}$ or $Bi_4V_{1.8}Cu_{0.2}O_{10.7}$; and a transition-metal oxide region comprising at least one selected from a group consisting of: titanium, vanadium, chromium, manganese, nickel, zirconium, niobium, hafnium and tantalum, wherein the transition-metal oxide region exhibits a filling-controlled metal-insulator transition.

* * * * *